United States Patent
Kohama

(10) Patent No.: US 11,183,494 B2
(45) Date of Patent: Nov. 23, 2021

(54) SEMICONDUCTOR INTEGRATED CIRCUIT

(71) Applicant: FUJI ELECTRIC CO., LTD., Kawasaki (JP)

(72) Inventor: Takanori Kohama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 2 days.

(21) Appl. No.: 16/775,493

(22) Filed: Jan. 29, 2020

(65) Prior Publication Data

US 2020/0286882 A1 Sep. 10, 2020

(30) Foreign Application Priority Data

Mar. 7, 2019 (JP) .............................. JP2019-041698

(51) Int. Cl.
*H01L 27/02* (2006.01)
*H03K 17/082* (2006.01)

(52) U.S. Cl.
CPC ...... *H01L 27/0255* (2013.01); *H01L 27/0288* (2013.01); *H03K 17/0828* (2013.01)

(58) Field of Classification Search
CPC ............ H01L 27/0255; H02L 27/0288; H03K 17/0828

See application file for complete search history.

(56) References Cited

U.S. PATENT DOCUMENTS

| | | | |
|---|---|---|---|
| 6,222,355 B1* | 4/2001 | Ohshima | H03K 17/0822 323/282 |
| 7,675,256 B2* | 3/2010 | Peng | H02P 6/34 318/400.01 |
| 2011/0101886 A1* | 5/2011 | Hattori | H05B 39/047 315/307 |
| 2014/0092515 A1* | 4/2014 | Morita | H01F 7/064 361/152 |
| 2017/0373583 A1 | 12/2017 | Nakajima et al. | |

FOREIGN PATENT DOCUMENTS

JP 2018007539 A 1/2018

\* cited by examiner

*Primary Examiner* — Thienvu V Tran
*Assistant Examiner* — Bart Iliya
(74) *Attorney, Agent, or Firm* — Rabin & Berdo, P.C.

(57) ABSTRACT

A semiconductor integrated circuit including a power switch element, a control circuit connected to the power switch element, an electrostatic discharge protection device connected to an input terminal to which an input voltage is applied, for protecting the power switch element and the control circuit from being damaged by an electrostatic discharge, and a short-to-supply fault protection circuit connected to the electrostatic discharge protection device, for protecting the power switch element and the control circuit from being damaged by a high voltage. The short-to-supply fault protection circuit includes a first step-down circuit disposed between the input terminal and the control circuit, and a second step-down circuit disposed between the input terminal and a gate of the power switch element. Each of the first and second step-down circuits, upon detecting the high voltage, steps down the high voltage for the control circuit or the power switch element.

10 Claims, 3 Drawing Sheets

SEMICONDUCTOR INTEGRATED CIRCUIT

CROSS-REFERENCE TO RELATED APPLICATION

This application is based upon and claims the benefit of priority of the prior Japanese Patent Application No. 2019-041698, filed on Mar. 7, 2019, the entire contents of which are incorporated herein by reference.

BACKGROUND OF THE INVENTION

1. Field of the Invention

The embodiment discussed herein relates to a semiconductor integrated circuit that is an igniter including: a power switch element that drives a load such as an ignition coil provided in an ignition system of a vehicular internal combustion engine; and a control circuit that protects the power switch element.

2. Background of the Related Art

An igniter includes a semiconductor power switch element that energizes and de-energizes the primary coil of an ignition coil to induce a high voltage in a secondary coil so as to cause an electric discharge at a spark plug. As the power switch element, a voltage-controlled semiconductor element such as an insulated gate bipolar transistor (IGBT) is used. Alternatively, as the power switch element, another voltage-controlled semiconductor element such as a metal-oxide-semiconductor field-effect transistor (MOSFET) may be used.

In the igniter, the power switch element is turned on when a gate voltage is applied to the input terminal of the igniter, and is turned off when no gate voltage is applied thereto. In this connection, the igniter further includes a control circuit to protect this power switch element. The control circuit may operate with the gate voltage applied to the input terminal as a power supply. In the igniter of this type, the control circuit does not operate while no gate voltage is applied.

In addition, the igniter is mounted in the vicinity of an internal combustion engine, is connected to an engine control unit (ECU) with a wire harness, and is controlled by a gate voltage supplied by the engine control unit. Therefore, the igniter is supplied with only the gate voltage from the engine control unit. However, in the wire harness at a location closer to the engine control unit, a wire for power supply to another circuit device may contact a signal wire for the gate voltage, which is connected to the input terminal of the igniter. If this happens, a short-to-supply fault may occur, in which a battery voltage is directly applied to the input terminal of the igniter.

In the igniter, the power switch element and control circuit operate with a low gate voltage of approximately 5 V, for example. When a short-to-supply fault occurs, a high battery voltage is applied, which may damage the igniter.

To deal with this, there is known an igniter in which its power switch element and control circuit are protected from being damaged even if a short-to-supply fault occurs (for example, see Japanese Laid-open Patent Publication No. 2018-007539). This igniter includes an input terminal to receive a gate voltage, and a short-to-supply fault protection circuit between the gate of the power switch element and the control circuit that operates with the gate voltage of the power switch element as a power supply voltage. This short-to-supply fault protection circuit includes a first voltage divider circuit that divides the voltage applied to the input terminal to produce a lower voltage, a switch element that is connected in series with the first voltage divider circuit and activates and inactivates the first voltage divider circuit, and a second voltage divider circuit that detects a voltage applied to the input terminal. In the case where a voltage applied to the input terminal is a normal gate voltage, the second voltage divider circuit turns off the switch element, and the first voltage divider circuit functions as only part of a gate resistor connected to the gate of the power switch element. On the other hand, when the second voltage divider circuit detects that the voltage applied to the input terminal increases to a prescribed voltage or higher, the switch element is turned on and the first voltage divider circuit is activated. The first voltage divider circuit divides the input voltage to produce a value close to the gate voltage. In this way, even if a short-to-supply fault occurs, the igniter protects the power switch element and control circuit from being damaged by an applied high voltage.

In addition, the igniter is provided with a circuit for protection against a surge voltage, at the input terminal to which the gate voltage is applied. A representative of the surge voltage is an electrostatic discharge (ESD) voltage. This protection circuit is formed of a Zener diode. When a surge voltage exceeding the breakdown voltage of the Zener diode is applied to the input terminal, the protection circuit becomes conductive and absorbs the surge voltage.

As described above, the igniter has, at the input terminal thereof, the short-to-supply fault protection circuit and the Zener diode for protection against surge voltage. Thereby, the power switch element and control circuit are protected against a relatively direct-current high voltage by the short-to-supply fault protection circuit, and are also protected against a pulse surge voltage by the Zener diode.

The conventional igniter is protected to some extent against the surge voltage by the Zener diode. However, considering the dynamic resistance and others of the Zener diode, a voltage that is the breakdown voltage of the Zener diode plus the voltage drop due to the dynamic resistance of the Zener diode is applied to the short-to-supply fault protection circuit. This voltage is higher than a voltage that is generated due to the short-to-supply fault, and changes too abruptly to be controlled by the short-to-supply fault protection circuit. That is, such a voltage is applied to the short-to-supply fault protection circuit. In the short-to-supply fault protection circuit, the second voltage divider circuit detects the high voltage that changes abruptly and turns on the switch element, and after that the first voltage divider is activated. For this reason, the following unavoidable problem occurs: active elements delay their operations, and during the delay, the high voltage is transferred to the inside.

SUMMARY OF THE INVENTION

According to one embodiment, there is provided a semiconductor integrated circuit, including: a power switch element; a control circuit connected to the power switch element for controlling the power switch element; an electrostatic discharge protection device connected between an input terminal to which an input voltage is applied, and the power switch element and the control circuit, for protecting the power switch element and the control circuit from being damaged by an electrostatic discharge; and a short-to-supply fault protection circuit connected between the electrostatic discharge protection device, and the power switch element and the control circuit, for protecting the power switch element and the control circuit from being damaged by a high voltage generated due to a short-to-supply fault, wherein the short-to-supply fault protection circuit includes a first step-down circuit that is disposed between the input terminal and the control circuit, and which, upon detecting the high voltage, steps down the high voltage to a first voltage to use as a power supply voltage for the control circuit, and a second step-down circuit that is disposed between the input terminal and a gate of the power switch element, and which, upon detecting the high voltage, steps down the high voltage to a second voltage to use as a gate voltage for the power switch element.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, a preferred embodiment will be described in detail with reference to the accompanying drawings. The following describes a case where a semiconductor integrated circuit is applied to an igniter of an ignition system of a vehicular internal combustion engine. In this connection, this case uses an IGBT as a power switch element of the igniter. Alternatively, a power MOSFET may be used.

Figure 1:
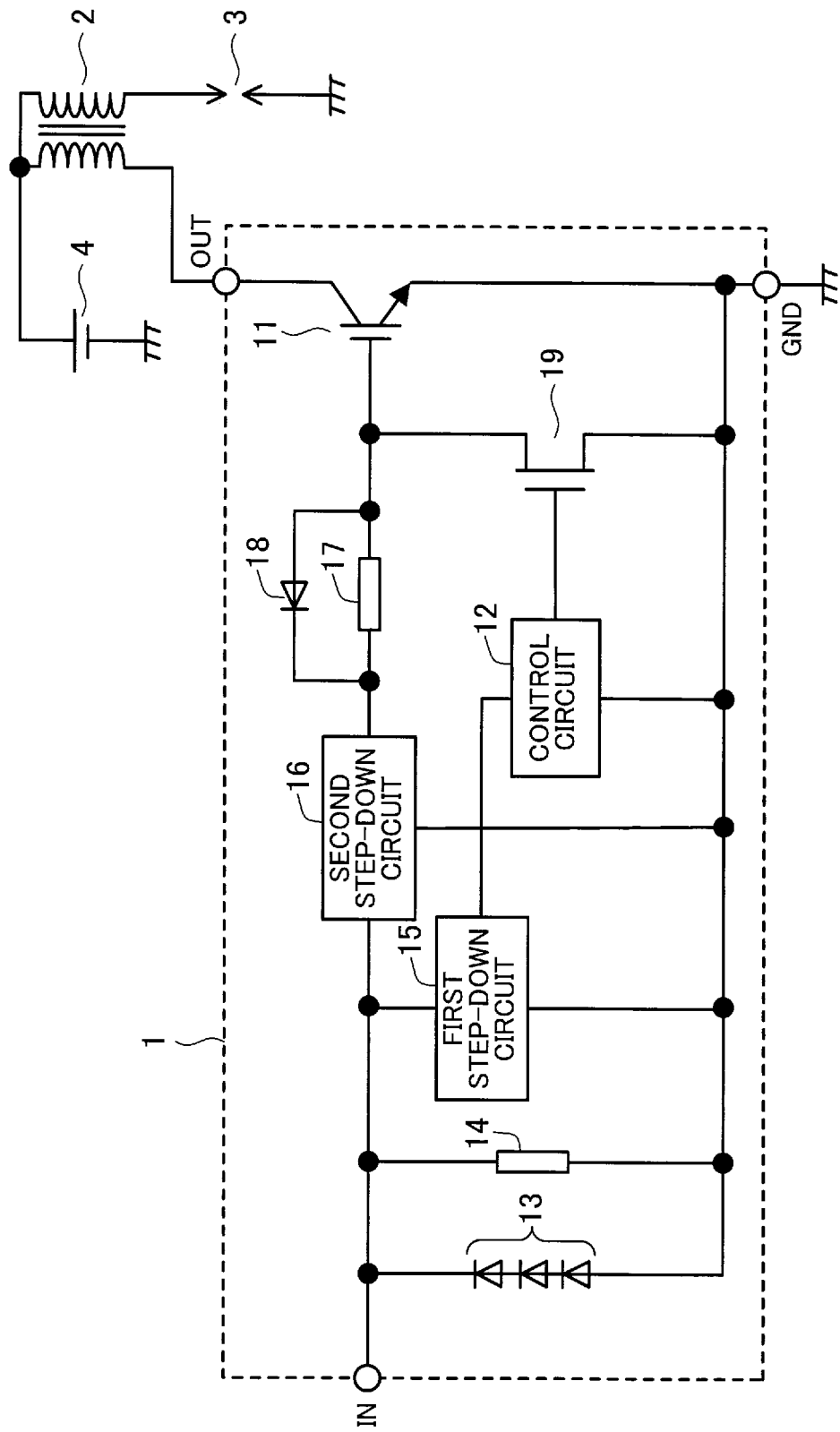
FIG. 1 illustrates an example of a configuration of an ignition system including an igniter according to one embodiment.
Figure 2:
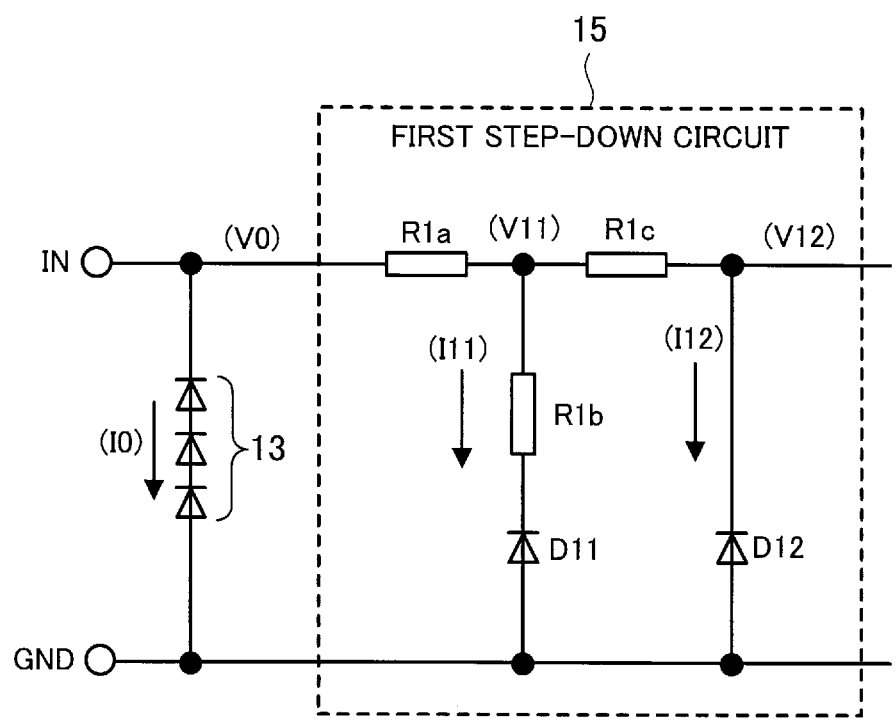
FIG. 2 illustrates an example of a first step-down circuit.
Figure 3:
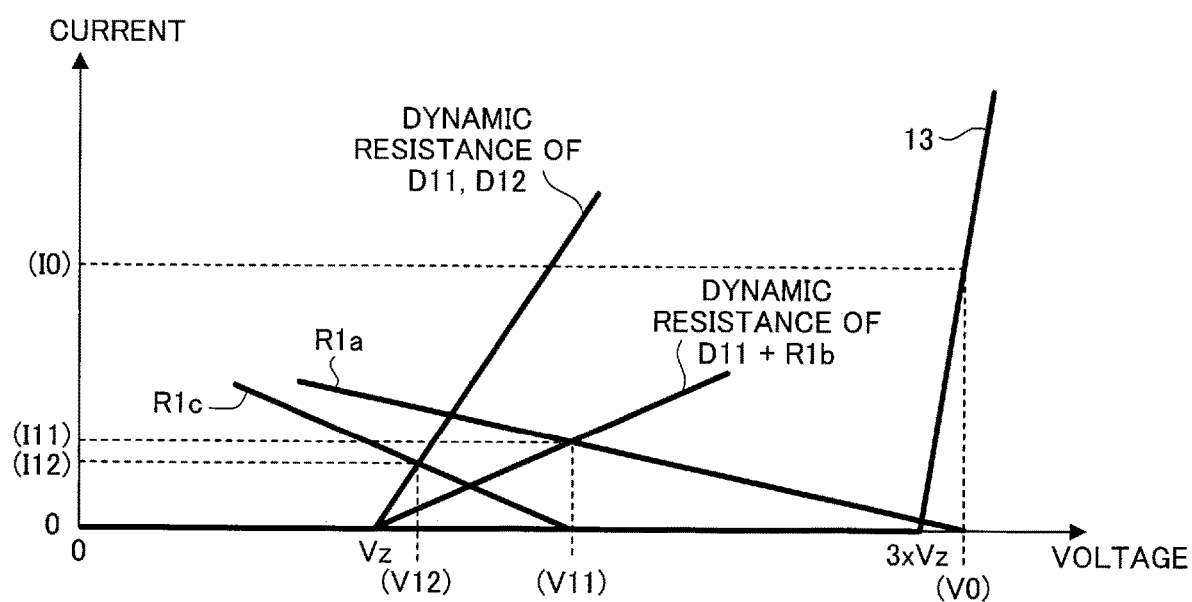
FIG. 3 is a view for explaining a step-down state that is seen when a high voltage is applied to the first step-down circuit.

FIG. 1 illustrates an example of a configuration of an ignition system including an igniter according to one embodiment. FIG. 2 illustrates an example of a first step-down circuit. FIG. 3 is a view for explaining a step-down state that is seen when a high voltage is applied to the first step-down circuit.

The ignition system includes an igniter 1, an ignition coil 2, and a spark plug 3. The positive terminal of a battery 4 is connected to one terminal of each of the primary coil and the secondary coil of the ignition coil 2. The battery 4 is a vehicle battery that outputs a 12 V voltage, for example. The igniter 1 energizes or de-energizes the ignition coil 2 according to a gate voltage supplied from an engine control unit. At the energization of the ignition coil 2, a current from the battery 4 flows through the primary coil. Therefore, the primary coil acts as an electromagnet and a collection of magnetic flux lines is generated inside a core wound by the primary coil. When the igniter 1 de-energizes the ignition coil 2 at prescribed ignition timing, the magnetic flux inside the core suddenly collapses, so that a high voltage is induced by electromagnetic induction in the secondary coil wound on the same core. When supplied with this high voltage, the spark plug 3 causes an electric discharge in its gap, which ignites and burns an air-fuel mixture in an engine combustion chamber.

The igniter 1 has an IGBT 11 that functions as a power switch element and a control circuit 12 that protects the IGBT. This embodiment is designed so that a gate voltage for controlling the IGBT 11 is supplied as a power supply voltage to the control circuit 12. Therefore, this igniter 1 has an input terminal IN, to which the gate voltage is applied, an output terminal OUT, which is connected to the primary coil of the ignition coil 2, and a ground terminal GND, which is connected to the chassis of a vehicle. The igniter 1, however, does not have a power supply terminal for the control circuit 12.

The input terminal IN of the igniter 1 is connected to the cathode of the Zener diode group 13 formed of three serially-connected Zener diodes. The anode of the Zener diode group 13 is connected to the ground terminal GND. This Zener diode group 13 is an electrostatic discharge protection device that protects the igniter 1 against electrostatic discharge. The electrostatic discharge occurs when an assembly device or the like contacts the input terminal IN. The Zener diodes forming the Zener diode group 13 each have a breakdown voltage of approximately 6 V. Therefore, the Zener diode group clamps a surge voltage applied to the input terminal IN to a voltage of approximately 18 V.

The input terminal IN is also connected to one terminal of a pull-down resistor 14. The other terminal of the pull-down resistor 14 is connected to the ground terminal GND. This pull-down resistor 14 is effective in the case where an output circuit of a drive circuit in the engine control unit is formed of a single transistor only. That is to say, consider the case where one transistor forms the output circuit of the drive circuit. When the IGBT 11 is turned off, no voltage is supplied to the gate, which increases an impedance of the output circuit. In this case, the pull-down resistor 14 discharges the charge accumulated in the gate capacitance of the IGBT 11, thereby making it possible to quickly lower the gate voltage to a threshold voltage or lower of the IGBT 11. In this connection, in the case where the output circuit of the drive circuit in the engine control unit has a push-pull circuit configuration, the contribution of the pull-down resistor 14 is small. This is because, when the IGBT 11 is turned off, the low-potential transistor in the push-pull circuit sinks the charge accumulated in the gate capacitance of the IGBT 11 as a sink current. Therefore, an electric discharge by the pull-down resistor 14 is not needed.

The input terminal IN is further connected to the input of each of the first step-down circuit 15 and the second step-down circuit 16 that form a short-to-supply fault protection circuit. The output of the first step-down circuit 15 is connected to the power supply terminal of the control circuit 12, and the output of the second step-down circuit 16 is connected to one terminal of the gate resistor 17 and the cathode of a speedup diode 18. The low potential terminal of each of the first step-down circuit 15 and second step-down circuit 16 is connected to the ground terminal GND. These first step-down circuit 15 and second step-down circuit 16 operate only when a battery voltage or surge voltage is applied to the input terminal IN, and does not operate when a normal gate voltage is applied thereto.

The other terminal of the gate resistor 17 and the anode of the speedup diode 18 are connected to the gate of the IGBT 11, the collector of the IGBT 11 is connected to the output terminal OUT, and the emitter of the IGBT 11 is connected to the ground terminal GND. When the IGBT 11 is turned off, a current flowing from the gate of the IGBT 11 to the input terminal IN does not pass through the gate resistor 17 but passes through the speedup diode 18, thereby accelerating the turn-off operation of the IGBT 11.

The output terminal of the control circuit is connected to the gate of a switch element 19. For example, this switch element 19 is formed of an N-channel MOSFET, and the drain and source thereof are connected to the gate and emitter of the IGBT 11, respectively. These control circuit 12 and switch element 19 protect the IGBT 11 from being damaged, by forcibly lowering the gate voltage of the IGBT 11 on the basis of an abnormality detection signal received from a circuit, not illustrated, which detects an overcurrent state or overheat of the IGBT 11 or a high locked state of an input signal by a timer.

With the igniter 1 configured as above, for example, a gate voltage of 5 V is applied by the engine control unit to the IGBT 11 via the second step-down circuit 16 and gate resistor 17. Therefore, when the gate capacitance of the IGBT 11 is charged and then the IGBT 11 is turned on, the current supplied from the battery 4 flows to the ground via the primary coil of the ignition coil 2 and the IGBT 11, so that the magnetic flux is generated inside the core of the ignition coil 2.

After that, when a gate voltage of 0 V is applied by the engine control unit, the charge accumulated in the gate capacitance of the IGBT 11 is consumed by the pull-down resistor 14 via the speedup diode 18 and the second step-down circuit 16. Or the charge accumulated in the gate capacitance is sunk into the engine control unit via the speedup diode 18 and the second step-down circuit 16. Thereby, the IGBT 11 is turned off, which produces such an abrupt change that the magnetic flux inside the core of the ignition coil 2 collapses. Therefore, a high voltage is induced by electromagnetic induction in the secondary coil of the ignition coil 2, which causes an electric discharge in a gap of the spark plug 3.

By repeatedly turning on and off the IGBT as described above, it is possible to cause an electric discharge at the spark plug 3 periodically and continuously. When an error is detected by the control circuit 12 while the IGBT 11 is repeatedly turned on and off, the control circuit 12 turns on the switch element 19 to forcibly lower the gate voltage of the IGBT 11 and turn off the IGBT 11. By doing so, the igniter 1 is able to protect the elements of the IGBT 11 from being damaged by the occurrence of the error.

The following describes a concrete example of the first step-down circuit 15 and second step-down circuit 16 as the short-to-supply fault protection circuit. The first step-down circuit 15 and second step-down circuit 16 have the identical circuit configuration, and therefore the first step-down circuit 15 will be described by way of example.

In the configuration exemplified in FIG. 2, the first step-down circuit 15 includes resistors R1$a$, R1$b$, and R1$c$ and Zener diodes D11 and D12. One terminal of the resistor R1$a$ is connected to the input terminal IN and the other terminal thereof is connected to one terminal of the resistor R1$b$. The other terminal of the resistor R1$b$ is connected to the cathode of the Zener diode D11, and the anode of the Zener diode D11 is connected to the ground terminal GND. The other terminal of the resistor R1$a$ is also connected to one terminal of the resistor R1$c$. The other terminal of the resistor R1$c$ is connected to the cathode of the Zener diode D12. The anode of the Zener diode D12 is connected to the ground terminal GND. The resistors R1$a$ and R1$c$ always connected to the control circuit 12 are each set to such a value as to produce a needed voltage drop, taking into account the current consumed by the control circuit 12. The resistors R1$a$ and R1$b$ have a division ratio for stepping down a battery voltage.

The Zener diodes D11 and D12 in the first step-down circuit 15 are not conductive while a gate voltage lower than the breakdown voltage of the Zener diodes D11 and D12 is applied to the input terminal IN. Therefore, the gate voltage is supplied to the control circuit 12 via the serially connected resistors R1$a$ and R1$c$. On the other hand, while a battery voltage is applied to the input terminal IN, the first step-down circuit 15 steps down the input voltage V0 to a voltage V11 at a step-down unit of a first stage, and then steps down the voltage V11 to a voltage V12 at a step-down unit of a second stage, and then supplies the voltage V12 to the control circuit 12. The voltage V12 of this time is equal to the breakdown voltage of the Zener diode D12 and close to the power supply voltage for the control circuit 12.

The breakdown voltage of the Zener diodes D11 and D12 is approximately 6 V, the same as that of the Zener diodes forming the Zener diode group 13. The step-down unit of the second and last stage in the first step-down circuit 15 is able to directly step down a voltage to 6 V that is close to the power supply voltage for the control circuit 12, only using the Zener diode D12. Therefore, a resistor for achieving a division ratio is not used, like the resistor R1$b$ of the first stage.

This first step-down circuit 15 does not include such elements that cause a delay in the time from receipt of a surge voltage to the start of the protection operation, like a transistor, and is configured with only elements which provide good responsiveness and whose actual delay operation may be ignored. Therefore, the first step-down circuit 15 is able to achieve not only a short-to-supply fault protection against the battery voltage but also a protection against a high voltage that changes abruptly in a short time, like a surge voltage.

The following describes how energy is absorbed and how a voltage to be supplied to the control circuit 12 is lowered, in the first step-down circuit 15 in the case where a battery voltage is applied to the input terminal IN of the igniter 1, with reference to FIGS. 2 and 3. In FIG. 2, a voltage V0 is applied to the input terminal IN, and a voltage V11 is a stepped-down voltage of the step-down unit of the first stage in the first step-down circuit 15. A voltage V12 is a stepped-down voltage of the step-down unit of the second stage. A current I0 flows through the Zener diode group 13, and a current I11 flows through the resistor R1$b$ and Zener diode D11 in the step-down unit of the first stage. A current I12 flows through the Zener diode D12 in the step-down unit of the second stage. In FIG. 3, the horizontal axis represents voltage, and the vertical axis represents current. A voltage Vz is a breakdown voltage of the Zener diodes of the Zener diode group 13 and the Zener diodes D11 and D12 of the first step-down circuit 15.

When a battery voltage is applied to the input terminal IN of the igniter 1, the battery voltage is first applied to the Zener diode group 13. The Zener diode group 13 is formed of three serially-connected Zener diodes, and therefore the total breakdown voltage is calculated as 3×Vz (3×6=18 V). The battery voltage is 12 V, and is 14 V while an alternator generates and supplies electric power. Therefore, the battery voltage is 16 V at the highest. Even when the battery voltage is applied to the input terminal IN, no current flows through the Zener diode group 13. However, when a surge voltage is applied to the input terminal IN, the current I0 flows through the Zener diode group 13 and a voltage across the both ends of the Zener diode group 13 is the voltage V0. Since the Zener diode group 13 has a dynamic resistance, the relationship between the voltage drop and the current is represented by a straight line that has an inclination based on the dynamic resistance with a voltage of 3×Vz as a start point.

In the first step-down circuit 15, the load line of the resistor R1$a$ in the step-down unit of the first stage is represented by a straight line with the voltage V0 as a start point. The relationship between the voltage drop due to the sum of the dynamic resistance of the Zener diode D11 and the resistance of the resistor R1b and the current is represented by a straight line with the voltage Vz as a start point. Therefore, the voltage V0 is stepped down by the step-down unit of the first stage to the voltage V11, which is at the crossing point of these lines. At this time, the current I11 flows through the resistor R1b and the Zener diode D11.

Then, the load line of the resistor R1c in the step-down unit of the second stage is represented by a straight line with the voltage V11 as a start point. The relationship between the voltage drop due to the dynamic resistance of the Zener diode D12 and the current is represented by a straight line with the voltage Vz as a start point. Therefore, the voltage V11 is stepped down by the step-down unit of the second stage to the voltage V12, which is at the crossing point of these lines. At this time, the current I12 flows through the Zener diode D12. That is, the voltage V12 that is output from the first step-down circuit 15 when the battery voltage is applied is a voltage that is the voltage drop due to the dynamic resistance of the Zener diode D12 plus the breakdown voltage of the Zener diode D12. The breakdown voltage of the Zener diode D12 is approximately 6 V, and the voltage drop due to the dynamic resistance of the Zener diode D12 is very small. Therefore, the battery voltage applied to the input terminal IN is clamped to a voltage of approximately 6 V, thereby achieving the short-to-supply fault protection.

Now consider the case where a surge voltage is applied to the input terminal IN. Due to the dynamic resistance of the Zener diode group 13, a voltage V0 higher than the voltage of 3×Vz is applied to the first step-down circuit 15 but is clamped to the voltage V11 as well. Thereby, the surge voltage applied to the control circuit 12 is prevented, without fail, from being transferred.

The second step-down circuit 16 has the same circuit configuration as the first step-down circuit 15, and the resistance value thereof is optimized so as to step down an applied surge voltage to a voltage close to a voltage that needs to be applied to the gate of the IGBT 11. Since the second step-down circuit 16 has the same circuit configuration as the first step-down circuit 15, the second step-down circuit 16 operates in the same way as the above-described first step-down circuit 15 when a battery voltage or surge voltage is applied to the input terminal IN.

The reason why this igniter 1 includes a short-to-supply fault protection circuit formed of the first and second step-down circuits 15 and 16 having the same functions, as described above, is because the gate voltage to be applied to the input terminal IN is used for some different purposes. That is, while receiving the gate voltage, the control circuit 12 performs the protection operation with the gate voltage as a power supply, whereas the IGBT 11 is supplied with a source current at the gate thereof and allows a sink current to be sunk from the gate thereof. Therefore, the igniter 1 is provided with the first step-down circuit 15 for the control circuit and the second step-down circuit 16 for the IGBT 11, in order to prevent a voltage drop due to the current consumed by the control circuit 12 from directly influencing the drop in the gate voltage of the IGBT 11.

In this connection, as seen in the configuration example of FIG. 2, the first step-down circuit 15 is formed of two stages: a step-down unit formed of the resistors R1a and R1b and Zener diode D11 and a step-down unit formed of the resistor R1c and Zener diode D12. However, the number of stages in the first step-down circuit 15 is not limited to two, and the first step-down circuit 15 may be formed of step-down units of three or more stages depending on a battery voltage.

In the semiconductor integrated circuit configured as above, the first and second step-down circuits step down not only a high voltage generated due to a short-to-supply fault but also a high voltage that changes abruptly, clamped by the electrostatic discharge protection device. Therefore, there is an advantage that an applied surge voltage is not transferred to the inside. In addition, the first step-down circuit ensures a power supply voltage for the control circuit and the second step-down circuit ensures a gate voltage for the power switch element. This allows a simple design of step-down circuits respectively for the power switch element and the control circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor integrated circuit, comprising:
    a power switch element having a gate;
    a gate resistor and a diode corrected in parallel, both connected to the gate of the power switch element;
    a control circuit connected to the power switch element for controlling the power switch element;
    an electrostatic discharge protection device connected between an input terminal to which an input voltage is applied, and the power switch element and the control circuit, for protecting the power switch element and the control circuit from being damaged by an electrostatic discharge; and
    a short-to-supply fault protection circuit connected between the electrostatic discharge protection device, and the power switch element and the control circuit, for protecting the power switch element and the control circuit from being damaged by a high voltage generated due to a short-to-supply fault, wherein
    the short-to-supply fault protection circuit includes
        a first step-down circuit that is disposed between the input terminal and the control circuit, and which, upon detecting the high voltage, steps down the high voltage to a first voltage to use as a power supply voltage for the control circuit, and
        a second step-down circuit that is disposed between the input terminal and the gate of the power switch element, the second step-down circuit being connected to the gate of the power switch element via the parallel-connected diode and gate resister, and upon detecting the high voltage, stepping down the high voltage to a second voltage to use as a gate voltage for the power switch element.

2. The semiconductor integrated circuit according to claim 1, wherein the first step-down circuit and the second step-down circuit each include a plurality of step-down circuits that sequentially step down the high voltage.

3. The semiconductor integrated circuit according to claim 2, wherein one of the step-down circuits located closest to the input terminal includes a first resistor, a second resistor, and a first Zener diode, which are connected in series.

4. The semiconductor integrated circuit according to claim 3, wherein
the plurality of step-down circuits correspond to a plurality of step-down stages, and
another one of the step-down circuits that is located at a last stage of the plurality of step-down stages includes a third resistor and a second Zener diode connected in series, and clamps a voltage applied by a second last stage of the plurality of step-down stages to a breakdown voltage of the second Zener diode.

5. The semiconductor integrated circuit according to claim 2, wherein
the first step-down circuit and the second step-down circuit are connected in parallel.

6. The semiconductor integrated circuit according to claim 1, further comprising a pull-down resistor connected in parallel with the electrostatic discharge protection device.

7. The semiconductor integrated circuit according to claim 1, wherein the semiconductor integrated circuit is an igniter in which the power switch element energizes and de-energizes an ignition coil.

8. The semiconductor integrated circuit according to claim 1, wherein
the first step-down circuit and the second step-down circuit are connected in parallel.

9. A semiconductor integrated circuit, comprising:
a power switch element;
a control circuit connected to the power switch element for controlling the power switch element;
an electrostatic discharge protection device connected between an input terminal to which an input voltage is applied, and the power switch element and the control circuit, for protecting the power switch element and the control circuit from being damaged by an electrostatic discharge; and
a short-to-supply fault protection circuit connected between the electrostatic discharge protection device, and the power switch element and the control circuit, for protecting the power switch element and the control circuit from being damaged by a high voltage generated due to a short-to-supply fault, wherein
the short-to-supply fault protection circuit includes
a first step-down circuit that is disposed between the input terminal and the control circuit, and which, upon detecting the high voltage, steps down the high voltage to a first voltage to use as a power supply voltage for the control circuit, and
a second step-down circuit that is disposed between the input terminal and a gate of the power switch element, and which, upon detecting the high voltage, steps down the high voltage to a second voltage to use as a gate voltage for the power switch element, wherein
the first step-down circuit includes a first plurality of step-down circuits that sequentially step down the high voltage,
one of the step-down circuits located closest to the input terminal includes a first resistor, a second resistor, and a first Zener diode, which are connected in series, and
another one of the step-down circuits that is located at a last stage of the first plurality of step-down stages includes a third resistor and a second Zener diode connected in series, and clamps a voltage applied by a second last stage of the first plurality of step-down stages to a breakdown voltage of the second Zener diode, and
wherein
the second step-down circuit includes a second plurality of step-down circuits that sequentially step down the high voltage,
one of the step-down circuits located closest to the input terminal includes a fourth resistor, a fifth resistor, and a third Zener diode, which are connected in series, and
another one of the step-down circuits that is located at a last stage of the second plurality of step-down stages includes a sixth resistor and a fourth Zener diode connected in series, and clamps a voltage applied by a second last stage of the second plurality of step-down stages to a breakdown voltage of the fourth Zener diode.

10. The semiconductor integrated circuit according to claim 9, wherein
the first step-down circuit and the second step-down circuit are connected in parallel.

* * * * *